United States Patent
Lee

(10) Patent No.: US 6,735,853 B2
(45) Date of Patent: May 18, 2004

(54) SUCTION HEAD OF A SURFACE MOUNTING DEVICE

(75) Inventor: Seung Won Lee, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 09/947,527

(22) Filed: Sep. 7, 2001

(65) Prior Publication Data

US 2002/0032960 A1 Mar. 21, 2002

(30) Foreign Application Priority Data

Sep. 9, 2000 (KR) .................................... 2000-0053698

(51) Int. Cl.⁷ ................................................. B23P 19/00
(52) U.S. Cl. ............................. 29/739; 29/740; 29/743; 29/DIG. 44; 294/2; 294/64.1
(58) Field of Search .......................... 29/740, 741, 743, 29/739, 721, DIG. 44; 294/2, 64.1; 414/752.1, 737; 901/40; 279/3

(56) References Cited

U.S. PATENT DOCUMENTS

| | | | | |
|---|---|---|---|---|
| 5,542,726 A | * | 8/1996 | Ozawa | 294/64.1 |
| 5,758,410 A | * | 6/1998 | Asai et al. | 29/740 |
| 5,996,203 A | | 12/1999 | Abe | 29/407.1 |
| 6,000,122 A | * | 12/1999 | Uchida et al. | 29/740 |
| 6,012,222 A | * | 1/2000 | Asai et al. | 29/832 |
| 6,161,886 A | * | 12/2000 | Furuya et al. | 294/64.1 |
| 2002/0032960 A1 | * | 3/2002 | Lee | 29/743 |
| 2002/0083584 A1 | * | 7/2002 | Isogai et al. | 29/743 |

* cited by examiner

Primary Examiner—Minh Trinh
(74) Attorney, Agent, or Firm—Fleshner & Kim, LLP

(57) ABSTRACT

A suction head for a mounting apparatus includes: a socket having a first through hole in an inner direction and a fixing member inside the first through hole, one end of the inside of the first through hole being mounted to a hollow shaft by using the fixing member, a nozzle having a second through hole for forming an air passage when sucking parts in the inner direction, a coupling member having a third through hole in the inner direction and plate spring members installed inside the third through hole for supporting the nozzle and for alleviating impact when the nozzle sucks parts, and a holder for fixing the nozzle so that it is not removed from the coupling member.

10 Claims, 7 Drawing Sheets

SUCTION HEAD OF A SURFACE MOUNTING DEVICE

BACKGROUND OF THE INVENTION

1. Field of the Invention

The present invention relates to a parts suction apparatus of a module head in a surface mount device, and more particularly, to a parts suction apparatus for suctioning surface mounting parts in a module head of a surface mount device used for mounting surface mounting parts on a printed circuit board.

2. Description of the Related Art

A surface mount device includes a X-Y gantry, a carrier, a module head and a vision system. The carrier is used for carrying the printed circuit board for mounting surface mounting electric and electronic parts (hereinafter, parts) to a working position of the surface mount device. The module head is used for picking up parts and carrying them onto the printed circuit board which is carried to the working position. The module head is mounted in the X-Y gantry and is moved to a X-Y direction to mount parts on the printed circuit board.

The parts carried and mounted onto the printed circuit board are picked up by a nozzle provided at the module head, and a position error of the parts picked up by the nozzle is sensed by the vision system. When an error occurs on the position of the parts picked up by the nozzle, the vision system rotates the nozzle finely to correct the position and then picks up the parts to mount the same on the printed circuit board. The module head picking up parts and carrying them onto the printed circuit board will now be described with reference to the accompanying drawings.

FIG. 1 is a front view of a module head of a surface mount device to which a nozzle rotating apparatus is adapted according to the conventional art. As illustrated therein, the module head 10 includes a plurality of heads 20a each head including a hollow shaft 11, a rotary shaft 12, a guide shaft 13 and a parts suctioning apparatus 20. The hollow shaft 11 is installed inside the rotary shaft 12, and the rotary shaft 12 is installed inside the guide shaft 13. The hollow shaft 11 is installed to be moved in a vertical direction inside the rotary shaft 12, and the rotary shaft 12 is installed to be rotated inside the guide shaft 13.

One end of the rotary shaft 12 is connected with a motor 1a by a timing belt 1b so that it can be rotated finely using a rotatory force generated from the motor 1a. On the outer circumferential surface of the hollow shaft 11, a guide member 11a is formed so that the hollow shaft 11 can be rotated when the rotary shaft 12 is rotated. The guide member 11a is installed inside a guide penetrating groove 12a of the rotary shaft 12. The guide member 11a is installed in such a manner that the hollow shaft 11 can be guided to the guide penetrating groove 12a when moving vertically inside the rotary shaft 12.

An air inlet 13a installed below the guide shaft 13 is used for introducing or running off air to the parts suction apparatus 20. When air is sucked out through the air inlet 13a, the parts suction apparatus 20 sucks parts, and when air is introduced, the parts suction apparatus 20 releases the sucked parts. The construction and operation of the parts suction apparatus 20 for sucking or removing parts will now be described with reference to the accompanying drawings.

FIG. 2 is a front view of a parts suction apparatus 29 mounted on a hollow shaft 11 shown in FIG. 1, and FIG. 3 is a front sectional view of the parts suction apparatus 29 shown in FIG. 2. As illustrated therein, the parts suction apparatus 20 mainly includes a socket 21, a bolt 22 (refer to FIG. 3), a hatch 23, a holder 24 and a nozzle 25. As illustrated in FIG. 3, when the bolt 22 is connected to the inside of the socket 21, the nozzle 25 is installed inside the holder 24 and then the holder 24 is installed inside the socket 21. Once the holder 24 is installed inside the socket 21, the latch 23 is installed on the socket 21 so that the holder 24 is supported by the socket 21.

To receive elastic force, a first spring 28 is installed on the outer circumferential surface of the socket 21 between the socket 21 and the latch 23, and a second spring 29 is installed between the holder 24 and the nozzle 25. The first and second springs 28 and 29 are used for alleviating impact when sucking parts. A first ball 26 installed below one end of the socket 21 is used for mounting or demounting the holder 24 on the socket 21. A second ball 27 is used for minimizing friction when installing the latch 23 on the socket 21. In order to mount and fix the nozzle 25 to the holder 24 installed on the socket 21 using the first ball 26, a pin hole 25a is formed. The pin hole 25a is installed by fixing the nozzle 25 to the holder 24 by using a pin (not shown). Therefore, a pin (not shown) is penetrated to the pin hole 25a, thereby fixing the nozzle 25 to the holder 24.

In the thusly constructed parts suction apparatus according to the conventional art, there is a problem that since the second spring is used for alleviating impact when sucking parts, the second spring installed between the holder and the nozzle is required to have a predetermined length in order to sufficiently absorb the impact caused by the suctioning of parts, and therefore the length of the nozzle becomes larger.

In addition, in the conventional parts suction apparatus, there is another problem that since a mechanism for elevating the socket to a predetermined height is needed for replacing the nozzle by changing the first ball installed on the socket from the fixed state to the free state, the construction of the parts suction apparatus is complicated and the replacing time of the nozzle is lengthened.

SUMMARY OF THE INVENTION

It is, therefore, an object of the present invention to provide a parts suction apparatus of a module head in surface mount device which can reduce nozzle replacement time by simplifying the mount structure of the parts suction apparatus using the plate spring members when mounting the holder to the socket or demounting the same.

It is another object of the present invention to provide a parts suction apparatus which can simplify the structure of the nozzle and decrease the length of the nozzle by using the plate spring members in order to alleviate impact when sucking parts.

To achieve the above object, there is provided a parts suction apparatus of a module head in surface mount device comprising: a socket having a first through hole in an inner longitudinal direction and a fixing member inside the first through hole, one end of the inside of the first through hole being mounted to a hollow shaft by using the fixing member; a nozzle having a second through hole for forming an air passage when sucking parts in an inner longitudinal direction; a coupling member installed to an inside of the first through hole formed the socket and having a third through hole in an inner longitudinal direction and a plurality of plate spring members installed inside the third through hole formed on the socket for supporting the nozzle when being installed at the other end of the inside of the first through hole and for alleviating impact when the nozzle sucks parts; and a holder for fixing the nozzle so that it is not removed from the coupling member when the nozzle is installed inside the third through hole of the coupling member.

Preferably, the nozzle has a taper formed on its outer circumferential surface so that it is supported by the plate spring member installed inside the third through hole of the coupling member, threads are formed on the outer circumferential surface of the coupling member and on the inner circumferential surface of the first through hole, respectively, in order to install the coupling member to the other end of the first through hole formed to the socket and a plurality of slots are formed to the inner circumferential surface of the third through hole of the coupling member in order to install the plate spring member inside the third through hole of the coupling member and are installed in opposition to each other.

Preferably, the number of the slots installed in opposition to each other is two and the number of the plate spring members installed at the slots formed inside the third through hole of the coupling member is identical to that of the slots, i.e., a first plate spring and a second plate spring, the plate spring member is provided with a shim in order to control elastic force or to control the initial position of the nozzle, and the holder has a plurality of latching members formed at predetermined portions so that the nozzle installed at the coupling member cannot be removed and the latching members are inserted into the slots formed to the inner circumferential surface of the third through hole of the coupling member.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will now be described with reference to the accompanying drawings.

Figure 1:
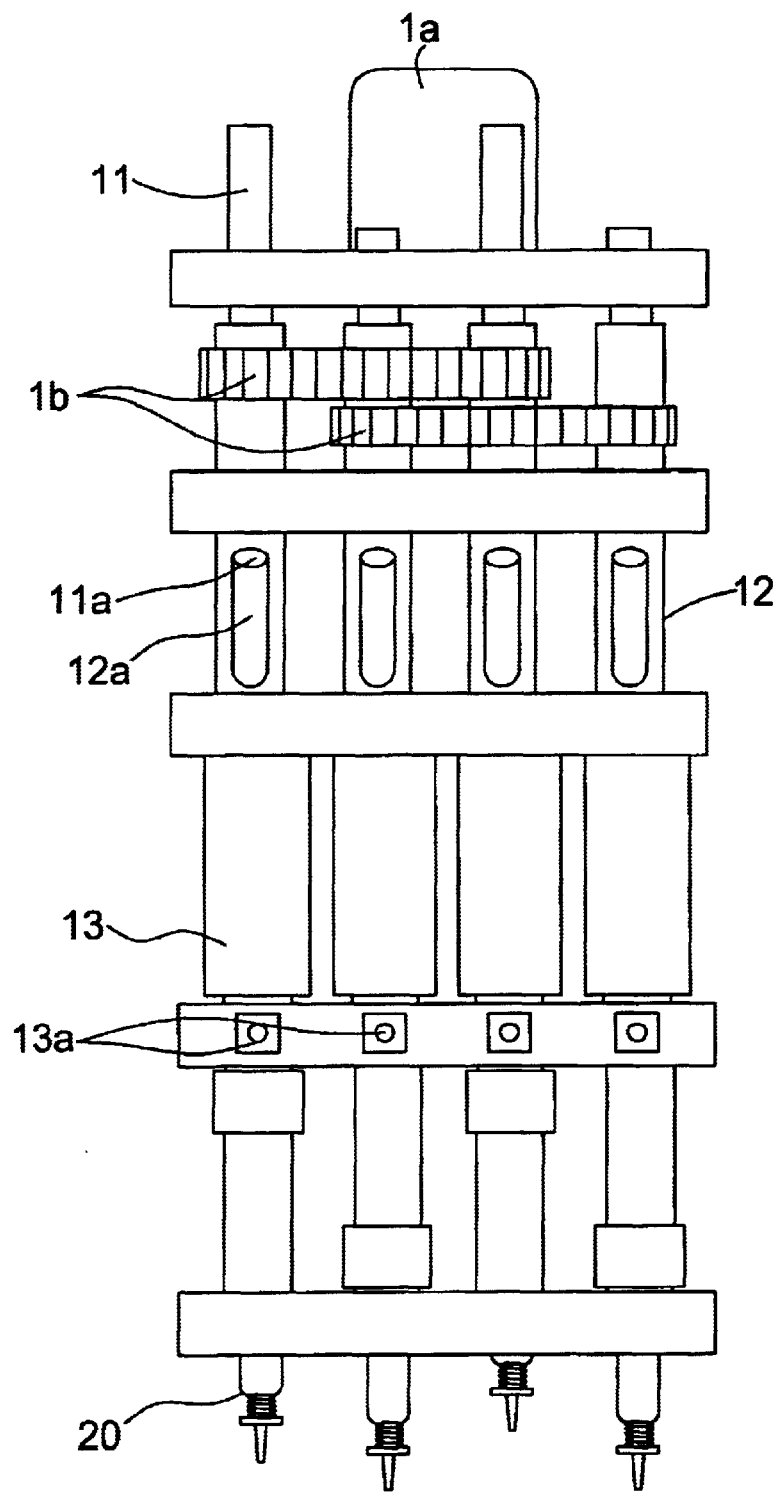
FIG. 1 is a front view of a module head of a surface mount device according to the conventional art.
Figure 2:
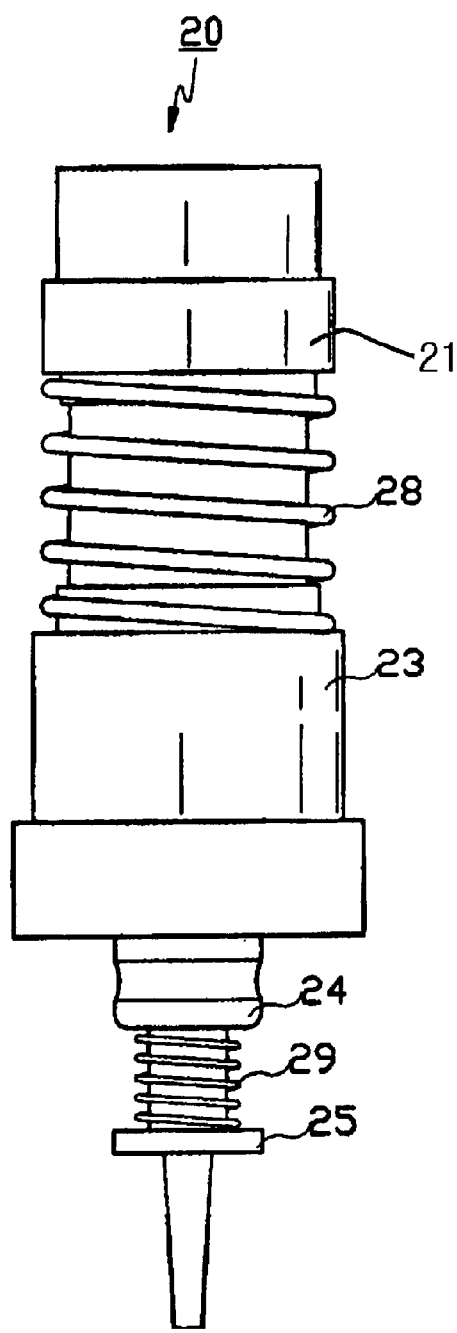
FIG. 2 is a front view of a parts suction apparatus mounted on a hollow shaft shown in FIG. 1.
Figure 3:
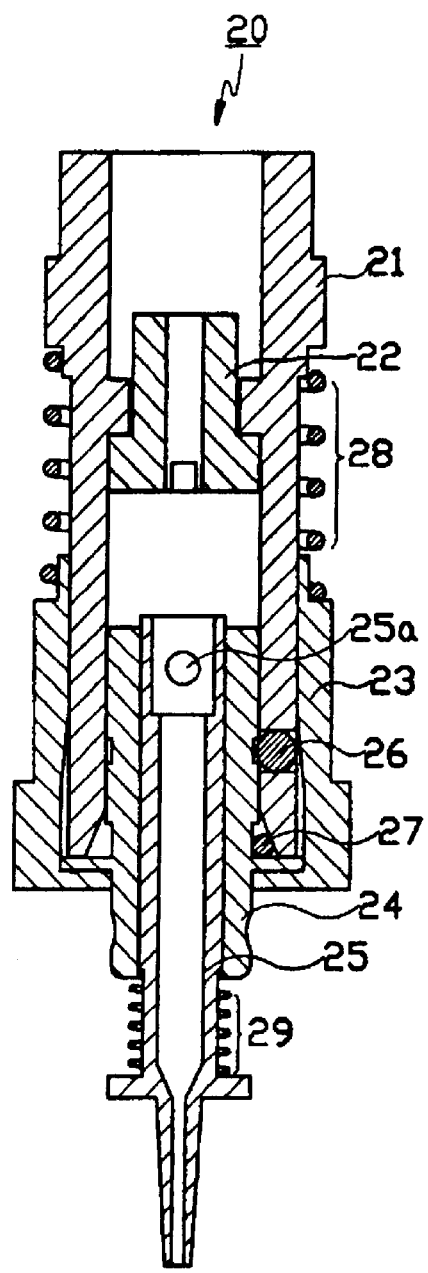
FIG. 3 is a front sectional view of the parts suction apparatus shown in FIG. 2.
Figure 4:
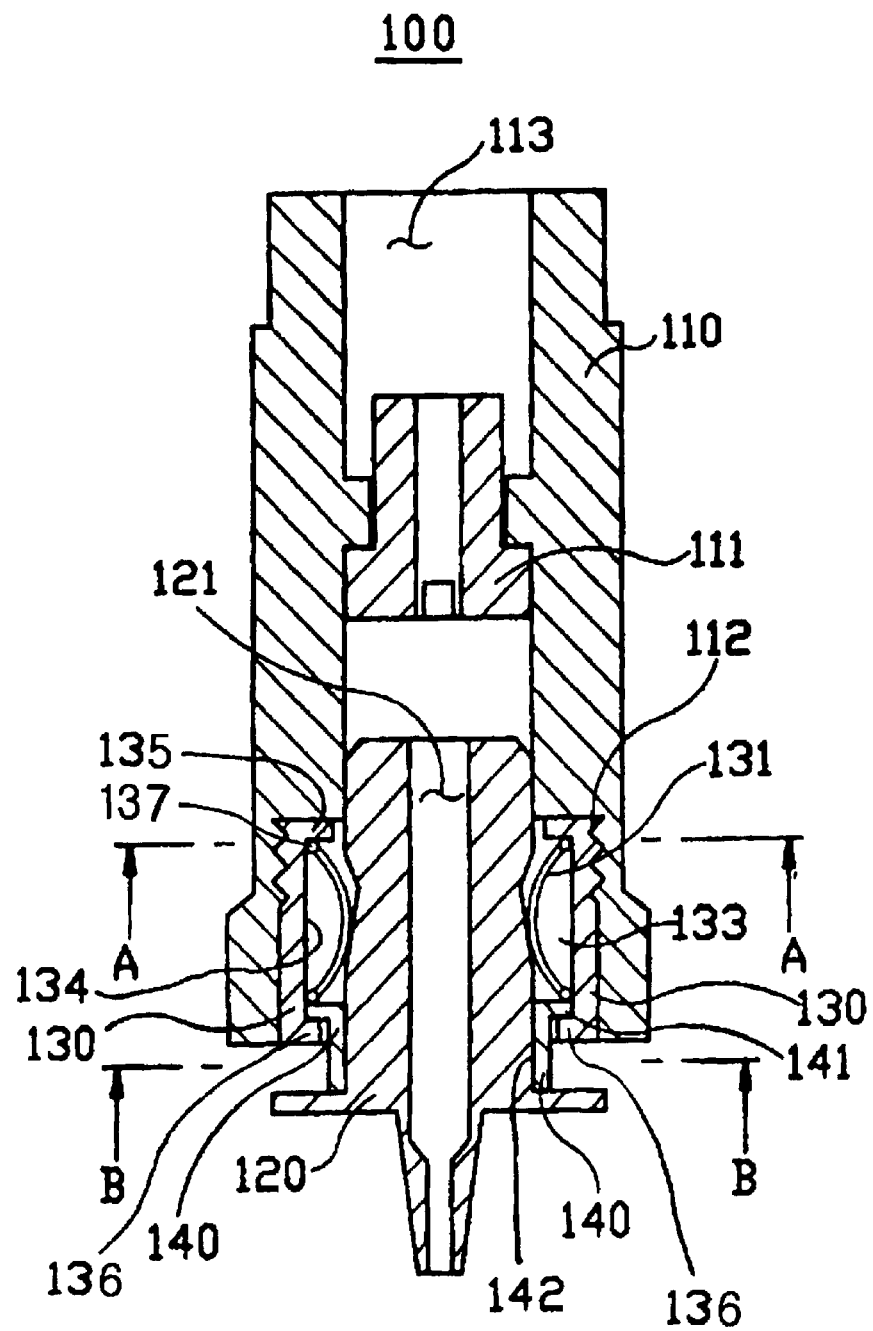
FIG. 4 is a front sectional view of a parts suction apparatus according to the present invention.

FIG. 4 is a front sectional view of a parts suction apparatus 100 according to the present invention. As illustrated therein, the parts suction apparatus 100 includes: a socket 110 having a first through hole 113 in an inner longitudinal direction and a fixing member 111 inside the first through hole 113, one end of the inside of the first through hole 113 being mounted to a hollow shaft (similar to that shown as element 11 of FIG. 1) by using the fixing member 111; a nozzle 120 having a second through hole 121 for forming an air passage when sucking parts (not shown) in an inner longitudinal direction; a coupling member 130 installed to an inside of the first through hole 113 formed in the socket 110 and having a third through hole 133 in an inner longitudinal direction and a plurality of plate spring members 131 installed inside the third through hole 133 formed on the socket 110 for supporting the nozzle 120 when being installed at the other end of the inside of the first through hole 113 and for alleviating impact when the nozzle 120 sucks parts; and a holder 140 for fixing the nozzle 120 so that it is not removed from the coupling member 130 when the nozzle 120 is installed inside the third through hole 133 of the coupling member 130.

The construction and operation of the present invention will now be described in more detail.

As illustrated in FIG. 4, the parts suction apparatus 100 of the present invention mainly includes a socket 110, a nozzle 120, a coupling member 130 and a holder 140. The coupling member 130 and the holder 140 are used for coupling and mounting the nozzle 120 to the socket 110. The coupling member 130 is installed inside the socket 110 for supporting the nozzle 120, and the holder 140 is installed on the coupling member 130 so that the nozzle 120 installed inside the coupling member 130 is not removed from the coupling member 130.

Moreover, the socket 110 has a first through hole 113 formed inside in a longitudinal direction. The first through hole 113 is formed such that the other end thereof is penetrated through one end of the socket 110. At one end of the first through hole 113, a hollow shaft 11 (not shown in FIG. 4) is installed by inserting the same. At the other end of the first through hole 113, a fixing member 111 is installed by inserting the same.

The fixing member 111 fixes the hollow shaft 14 (not shown in FIG. 4) and the socket 110. As the fixing member 111, a bolt is commonly used. The bolt is installed inside the first through hole 113 and is engaged to a nut (not shown) formed on the inner circumferential surface of the hollow shaft (not shown in FIG. 4), for thereby firmly fixing the socket 110 to the hollow shaft.

The fixing member 111 fixes the hollow shaft 11 and the socket 110. As the fixing member 111, a bolt is commonly used. The bolt is installed inside the first through hole 113 and is engaged to a nut (not shown) formed on the inner circumferential surface of the hollow shaft 11, for thereby firmly fixing the socket 110 to the hollow shaft 11.

Figure 5:
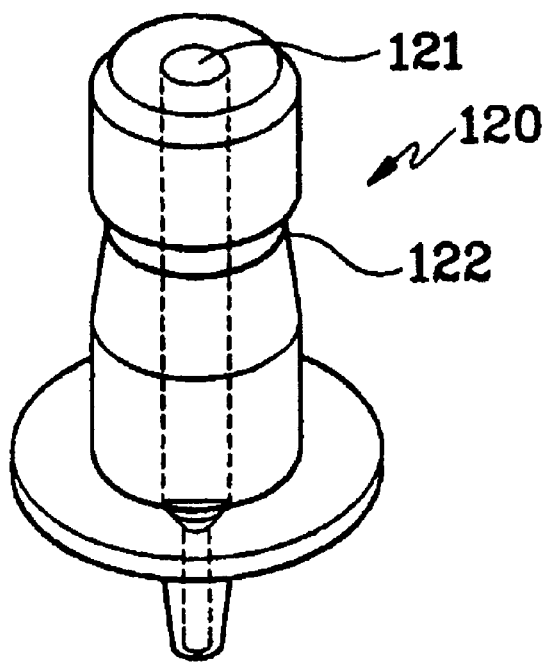
FIG. 5 is a perspective view of a nozzle shown in FIG. 4.

Below the fixing member 111, a nozzle 120 is mounted in correspondence with the first through hole 113. The nozzle 120 has a second through hole 121 formed in its inner longitudinal direction. The second through hole 121 formed in the nozzle 120 forms an air flow passage for sucking or removing parts. As illustrated in FIGS. 4 and 5, the nozzle 120 has a taper 122 formed on its outer circumferential surface so that it is supported by the plate spring member 131 installed inside the third through hole 133 of the coupling member 130.

Inside the coupling member 130, a plurality of plate spring members 131 are installed in a longitudinal direction, and between the nozzle 120 and the coupling member 130, the third through hole 133 is formed.

As illustrated in FIG. 4, threads 112 are formed on the inner circumferential surface or the first through hole 113 of the socket 110 in correspondence with the threads 132 formed on the outer circumferential surface of the coupling member 130. By forming the threads 112 and 132 respectively on the outer circumferential surface of the coupling member 130 and on the inner circumferential surface of the first through hole 113, the socket 110 and the coupling member 130 are connected by the treads 112 and 132 when engaging the coupling member 130 to the socket 110.

Figure 6:
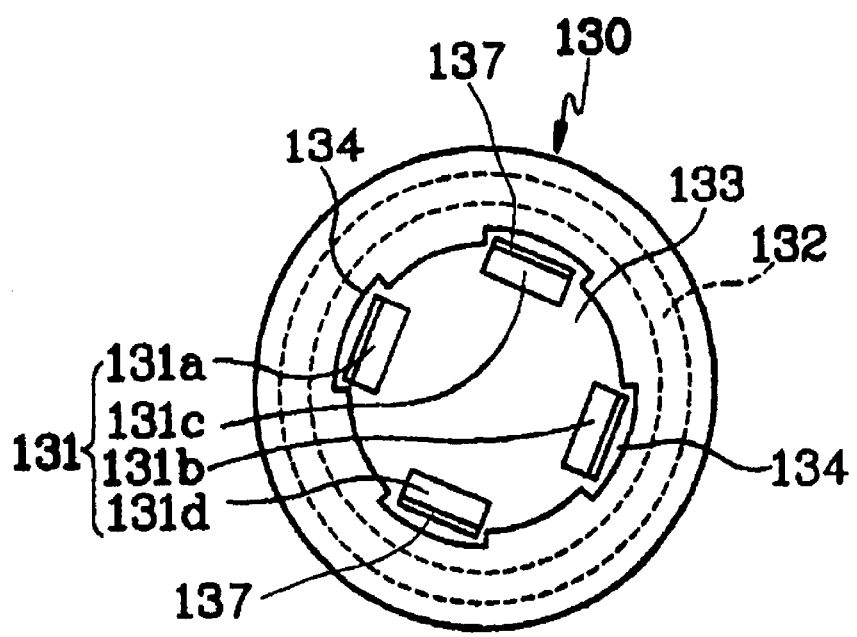
FIG. 6 is a cross-sectional view of line A–A' of a coupling member shown in FIG. 4.

Inside the third through hole 133 of the coupling member 130 installed inside the first through hole 113 of the socket 110, the plate spring members 131 are installed for supporting the nozzle 120 and alleviating impact when the nozzle 120 sucks parts. The plate spring member 131 is provided with a shim 137 in order to control elastic force or to control the initial position of the nozzle 120. To fixedly install the plate spring member 131 inside the third through hole 133, as illustrated in FIG. 6, a plurality of slots 134 are formed inside the coupling member 130.

The slots 134 are formed concavely from the inner circumferential surface of the third through hole 133. The slots 134 are installed in opposition to each other. Preferably, four slots 134 are formed in order to support the taper 122 portion of the nozzle 120 more firmly. In the case that the four slots 134 are formed on the inner circumferential surface of the third through hole 133, the four slots 134 are formed in pairs in the opposite direction.

The number of plate spring members 131 installed at the slots 134 formed inside the third through hole 133 of the coupling member 130 is identical to that of the slots 134. For example, if two slots 134 are provided, two plate spring members 131 i.e., a first plate spring 131a and a second plate spring 131b, are installed at its respective slot 134. If four slots 134 are provided, four plate spring members 131, i.e., a first plate spring 131a, a second plate spring 131b, a third plate spring 131c and a fourth plate spring 131d, are installed at its respective slot 134.

The nozzle 120 is inserted and installed into a fourth through hole 142 of the holder 140 to be installed at the slot 134 formed inside the coupling member 130 before the nozzle 120 is installed inside the third through hole 133 of the coupling member 130, so that both ends of the plate spring member 131 can be supported by a first supporting jaw 135 formed at one side of the coupling member 130 and a second supporting jaw 136 formed at the other side of the coupling member 130.

Figure 7:
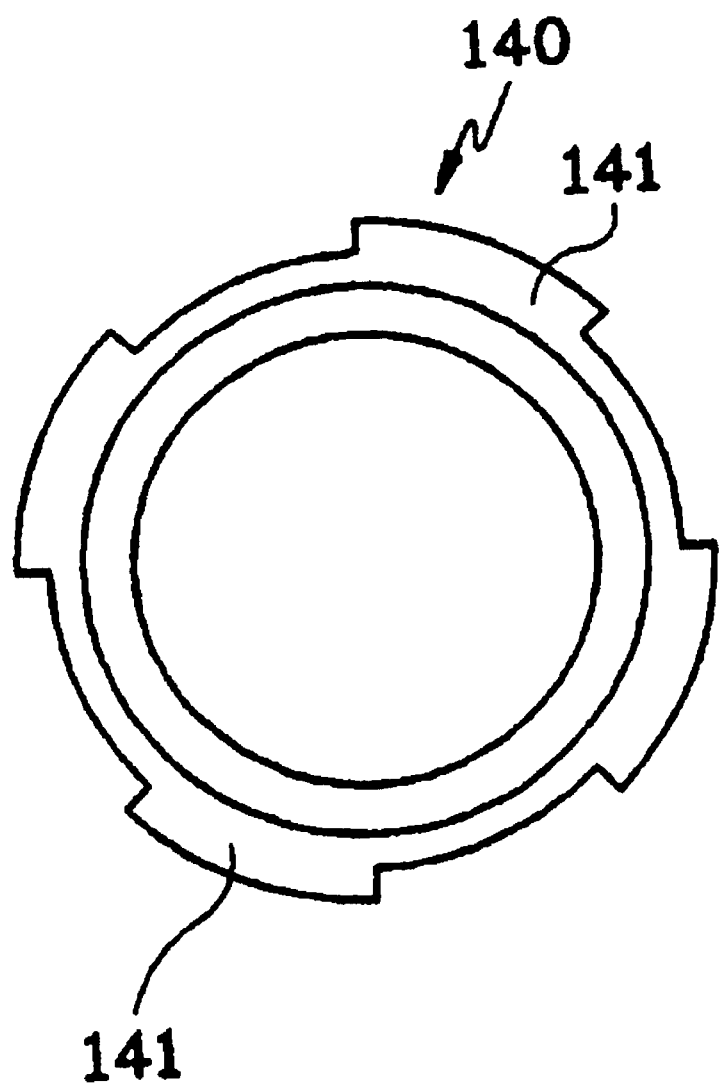
FIG. 7 is a cross-sectional view of line B–B' of a holder shown in FIG. 4.

The holder 140 fixes the nozzle 120 installed at the coupling member 130 so that the nozzle 120 cannot be removed from the third through hole 133. The holder 140, as illustrated in FIG. 7, has a plurality of latching members 141 formed at predetermined portions.

The latching members 141 are formed in the same shape as the slots 134 formed on the inner circumferential surface of the third through hole 133, and have a proper size to be inserted into the slots 134.

Moreover, when the latching members 141 are inserted into the slots 134 formed at the coupling member 130 and then are rotated at a predetermined angle, the latching members 141 are latched to the second supporting jaw 136 of the coupling member 130 for thereby supporting the nozzle 120 installed inside the coupling member 130.

As explained above, the parts suction apparatus of the present invention can reduce nozzle replacement time by simplifying the mount structure of the parts suction apparatus using the plate spring members when mounting the holder to the socket or demounting the same, and can simplify the structure of the nozzle and decrease the length of the nozzle by using the plate spring members in order to alleviate impact when sucking parts.

According to the present invention, there are several advantages that the parts suction apparatus of the present invention can reduce nozzle replacement time by simplifying the mount structure of the parts suction apparatus using the plate spring members when mounting the holder to the socket or demounting the same, and can simplify the structure of the nozzle and decrease the length of the nozzle by using the plate spring members in order to alleviate impact when sucking parts.

What is claimed is:

1. A suction head of a surface mounting device, comprising:
   a socket having a first through hole formed extending in a longitudinal direction of the socket;
   a fixing member positioned inside the first through hole;
   a nozzle having a second through hole formed extending in a longitudinal direction of the nozzle and forming an air passage for sucking parts;
   a coupling member installed inside of the first through hole of the socket, the coupling member and having a third through hole formed extending in a longitudinal direction thereof, and a plurality of plate spring members installed inside the third through hole formed and configured to support the nozzle installed inside of the first through hole and to alleviate impact when the nozzle sucks the parts; and
   a holder configured to fix the nozzle so that it the nozzle is not removed from the coupling member when the nozzle is installed inside the third through hole of the coupling member.

2. The suction head of claim 1, wherein the nozzle further comprises a taper formed on its outer circumferential surface so that it is supported by the plurality of plate spring members installed inside the third through hole of the coupling member.

3. The suction head of claim 2, wherein the taper on the outer circumferential surface of the nozzle has a contour that causes the plate spring members to be deflected by varying amounts, depending on an amount of deflection of the nozzle with respect to the socket.

4. The suction head of claim 1, wherein threads are formed on an outer circumferential surface of the coupling member and on the an inner circumferential surface of the first through hole, respectively, in order to install the coupling member to an end of the first through hole formed in the socket.

5. The-parts suction apparatus head of claim 1, wherein a plurality of slots are formed in an inner circumferential surface of the third through hole of the coupling member in order to install the corresponding plate spring members inside the third through hole of the coupling member, wherein the plurality of slots are installed in opposition to each other.

6. The suction head of claim 5, wherein the number of the slots installed in opposition to each other is at least two and the number of plate spring members formed inside the third through hole of the coupling member is identical to the number of slots.

7. The suction head of claim 1, wherein each plate spring member further comprises a shim configured to control an elastic force or to control an initial position of the nozzle.

8. The suction head of claim 1, wherein the holder has a plurality of latching members formed at predetermined positions so that the nozzle installed at the coupling member cannot be removed, the latching members being inserted into slots formed at an inner circumferential surface of the third through hole of the coupling member.

9. The suction head of claim 1, wherein the fixing member comprises a bolt.

10. The suction head of claim 1, wherein one end of the inside of the first through hole is configured to be mounted to a hollow shaft using the fixing member.

* * * * *